United States Patent
So

[11] Patent Number: 6,028,465
[45] Date of Patent: Feb. 22, 2000

[54] ESD PROTECTION CIRCUITS

[75] Inventor: Jason Siucheong So, Carrollton, Tex.

[73] Assignee: STMicroelectronics, Inc., Carrollton, Tex.

[21] Appl. No.: 09/227,941

[22] Filed: Jan. 11, 1999

Related U.S. Application Data

[62] Division of application No. 08/771,670, Dec. 23, 1996.

[51] Int. Cl.$^7$ ........................................................ H03K 5/08
[52] U.S. Cl. ............................ 327/321; 327/325; 361/56
[58] Field of Search ................................. 327/321, 320, 327/314, 325; 361/56, 91

[56] References Cited

U.S. PATENT DOCUMENTS

| | | | |
|---|---|---|---|
| 4,716,302 | 12/1987 | Flannagan et al. | 327/546 |
| 4,736,271 | 4/1988 | Mack et al. | 361/91 |
| 5,034,845 | 7/1991 | Murakami | 361/56 |
| 5,124,578 | 6/1992 | Worley et al. | 326/34 |
| 5,163,174 | 11/1992 | Beeken | 330/10 |
| 5,264,723 | 11/1993 | Strauss | 257/532 |
| 5,287,241 | 2/1994 | Puar | 361/56 |
| 5,654,574 | 8/1997 | Williams et al. | 327/313 |

OTHER PUBLICATIONS

Sung–Mo Kang and Yusuf Leblebici, "CMOS Digital Integrated Circuits; Analysis & Design", McGraw–Hill, 1995, pp. 480–483.

*Primary Examiner*—Terry D. Cunningham
*Attorney, Agent, or Firm*—Theodore E. Galanthay; Lisa K. Jorgenson; Renee M. Larson

[57] ABSTRACT

Electro-static-discharge (ESD) protection circuits are supplied for inhibiting the destruction of buffers, drivers, logic and memory cells in Metal-Oxide-Semiconductor (MOS) devices such as a CMOS device including Static-Random-Access-Memory (SRAM). This is accomplished by tiering diodes adjacent the input of the chip and in certain specific areas internally of the chip (e.g. power supplies etc.) providing bidirectional diode protection from over-voltage.

8 Claims, 4 Drawing Sheets

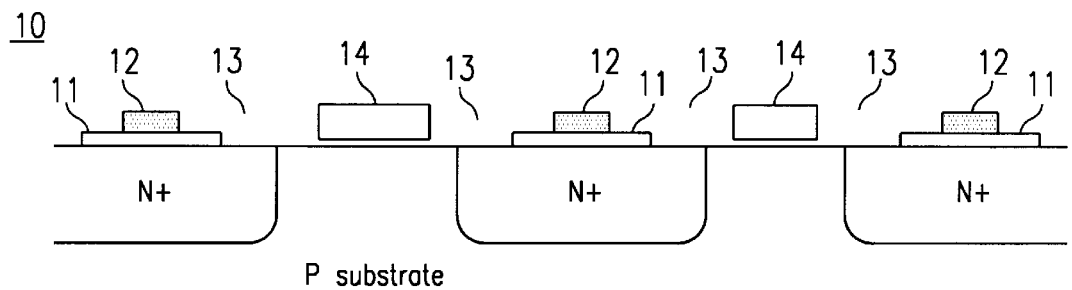
FIG. 3A
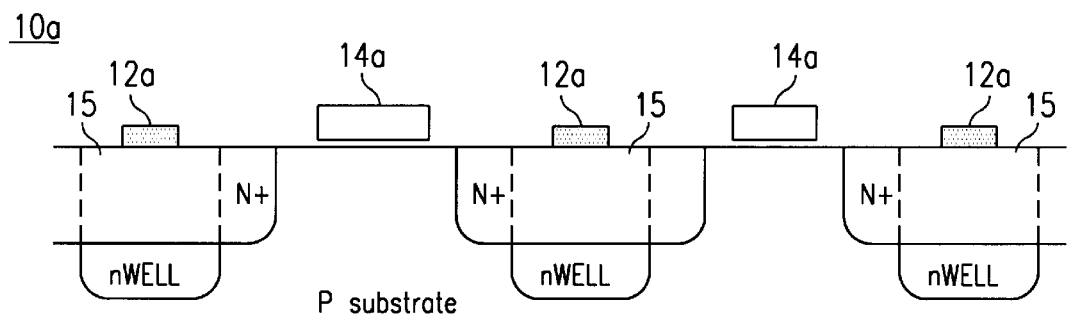
FIG. 3B
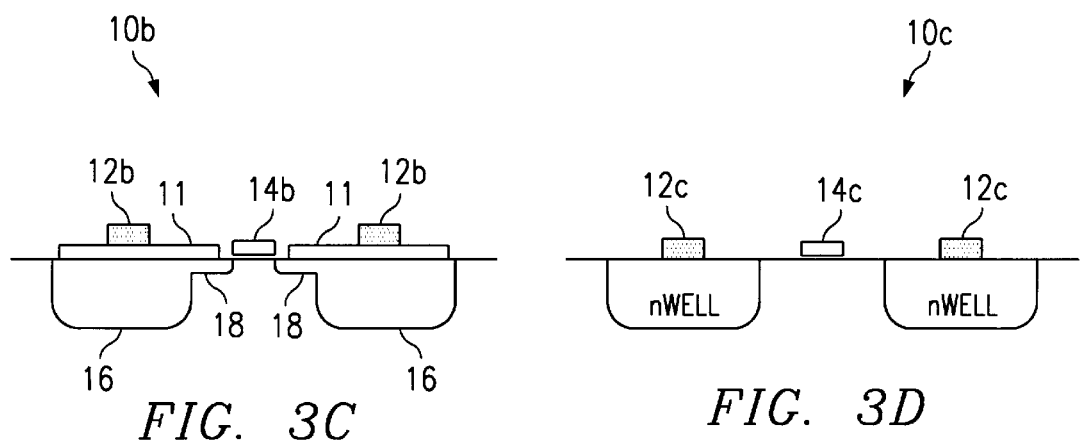
FIG. 3C
FIG. 3D

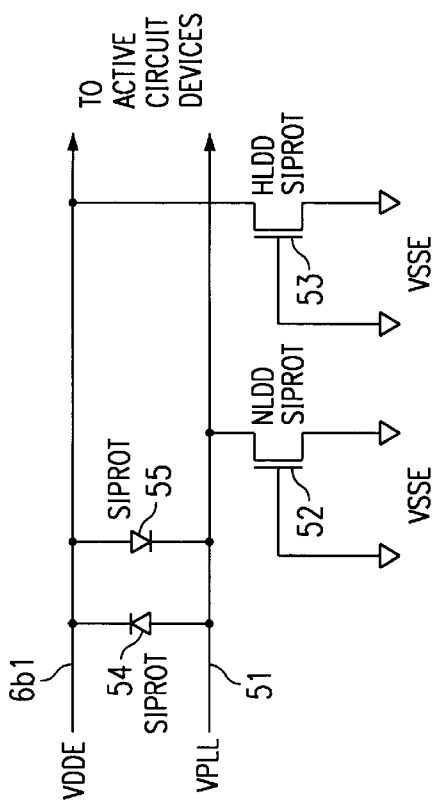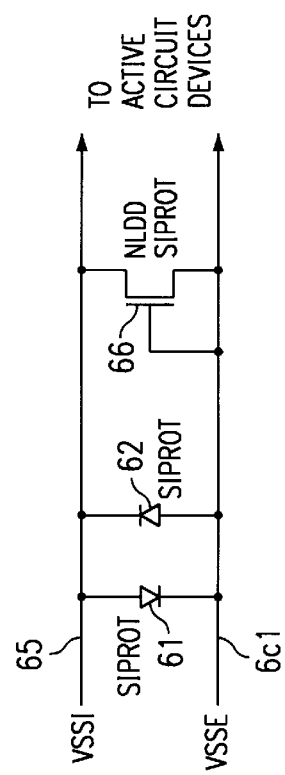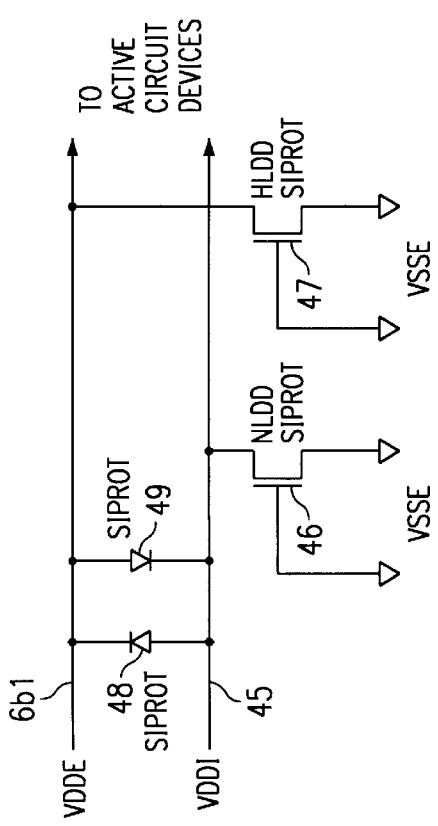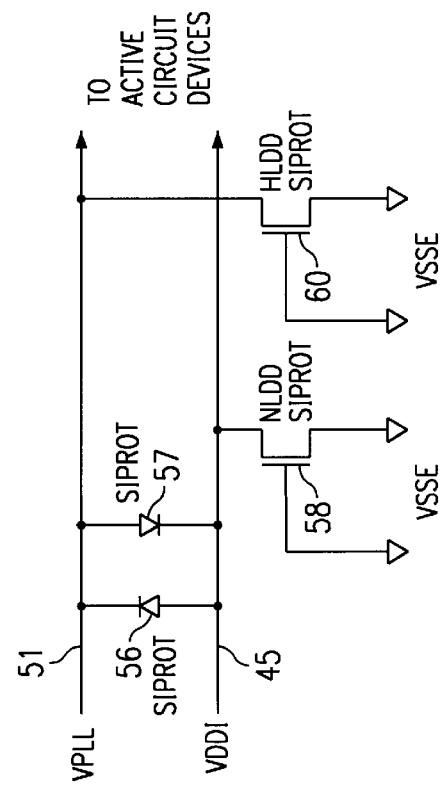

ESD PROTECTION CIRCUITS

This application is a division of application Ser. No. 08/771,670, filed Dec. 23, 1996, which is hereby incorporated by reference.

BACKGROUND OF THE INVENTION

1. Field of the Invention

The present invention relates to protection for Metal Oxide Semiconductor (MOS) integrated circuits such as Static-Random-Access-Memory (SCRAM) and more particularly relates to protection schemes against electrostatic discharge from either human or machine handling, while minimizing effects on the circuits to which the schemes are applied.

2. Description of Related Art

Electrostatic discharge (ESD) is one of the most prevalent causes for chip failures in both chip manufacturing and field operations. ESD can occur when the charges stored in machines or the human body are discharged to the chip on contact or by static induction. FIG. 1 shows different models for ESD testing. FIG. 1A shows the test for duplicating the human body model (HBM); FIG. 1B the test for duplicating the machine model (MM), and; FIG. 1C the test for duplicating the Charged Device Model (CDM).

A human walking across synthetic carpet in 80% relative humidity can potentially induce 1.5 kV of static voltage stress. In the HBM (MIL-STD 883C; Method 3015, 1988) shown in FIG. 1A, a touch of a charged person's finger is simulated by discharging a 100-pF capacitor through a 1.5K resistor. It is important that some protection network be designed into the I/O circuits of the chip so that the ESD effect can be filtered out before its propagation to the internal logic circuit effects destruction of one or more circuit elements. In addition to human handling, contact with machines can also cause ESD stress. Since body resistance is absent, the stress can be even more severe and with higher current levels. The schematic diagram of the machine model is shown in FIG. 1B. In that model the 1.5K resistor, representing the human in line impedance, is removed and a straight short condition with a 200 pf capacitor is discharged directly through the grounded DUT (device under test).

The third model is the charged device model shown in FIG. 1C. This model is intended to illustrate the discharge of the packaged integrated circuits. The charge can be accumulated either during the chip assembly process or in the shipping tubes. The CDM ESD testers electrically charge the Device Under Test (DUT) and then discharge it to ground, thus providing the high short-duration current pulse to DUT.

Small chip size, small diameter power bussing metal runs, and limited power/ground pins present particular problems with ESD irrespective of the type of CMOS device.

Larger chips have more capacitance (more available for charge storage) and are easier to handle; the smaller the chip, the more difficult the ESD problem. Moreover, narrow power bussing metal runs means the current carrying capacity of the metal is limited (acts like a fuse) and ofttimes, a static discharge will blow (melt to short or open) the line.

Power buss size is a dependency, requiring an ESD solutions. In the same manner limited ground line area is an obvious problem, because the line cannot dissipate heat due to excess current fast enough and sometimes causes adjacent device breakdown.

SUMMARY OF THE INVENTION

In view of the above, it is a principal object of the present invention to provide means for nullifying, to the extent possible, the deleterious effects of electro-static discharge in MOS devices.

Another object of the present invention is to provide means for enhancing the discharge of electro-static charges on chips by providing an easier path to ground and bypassing the active and passive elements to ground.

The forgoing objects are accomplished by Electro-static-discharge (ESD) protection means which include tiered diodes and capacitors adjacent the input and output pins of the chip. Additionally, bi-directional diode protection from over-voltage is provided in certain specific internal areas of the chip to protect against internal shorts to and from the power supplies.

Other objects and a more complete understanding of the invention may be had by referring to the following description taken in conjunction with the accompanying drawings in which:

BRIEF DESCRIPTION OF THE DRAWING(S)

FIG. 3A is a fragmentary, cross sectional view of a portion of a CMOS integrated circuit chip and an n-channel transistor in which salicide is employed in conjunction with the chip, and openings are provided therein surrounding the N+ contacts of the active devices so that nWELLs are unnecessary.

FIG. 3B is a fragmentary, cross sectional view of a portion of a CMOS integrated circuit chip and n-channel transistor utilizing no salicide but employing nWELLs below N+ contacts;

FIG. 3C is a fragmentary, cross sectional view of a p or n channel transistor employing LDD and salicide;

FIG. 3D is a fragmentary, cross sectional view of a p or n channel transistor with NLDD and processed without salicide, necessitating nWELLs;

FIG. 6–9 are schematic diagrams illustrating protection schemes specifically tailored for protection of power supplies internally of an MOS integrated circuit device.

DESCRIPTION OF THE ILLUSTRATIVE EMBODIMENT(S)

Figure 1A:
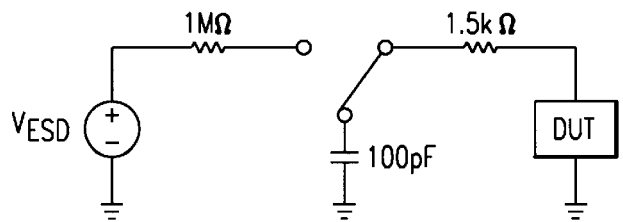
FIG. 1A is a schematic, prior art diagram showing the ESD test for duplicating the human body model (HBM).
Figure 1B:
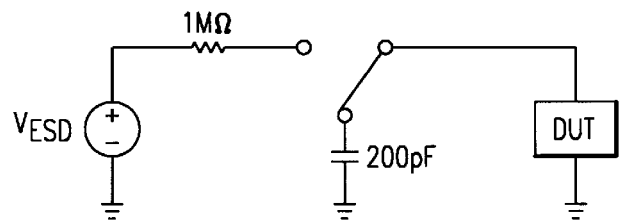
FIG. 1B is a schematic, prior art diagram showing the ESD test for duplicating the machine model (MM).
Figure 1C:
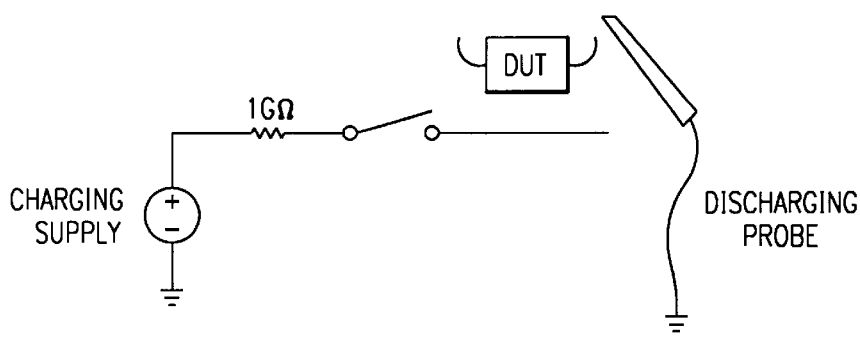
FIG. 1C is a schematic, prior art diagram showing the ESD test for duplicating the charged device model (CDM).
Figure 2:
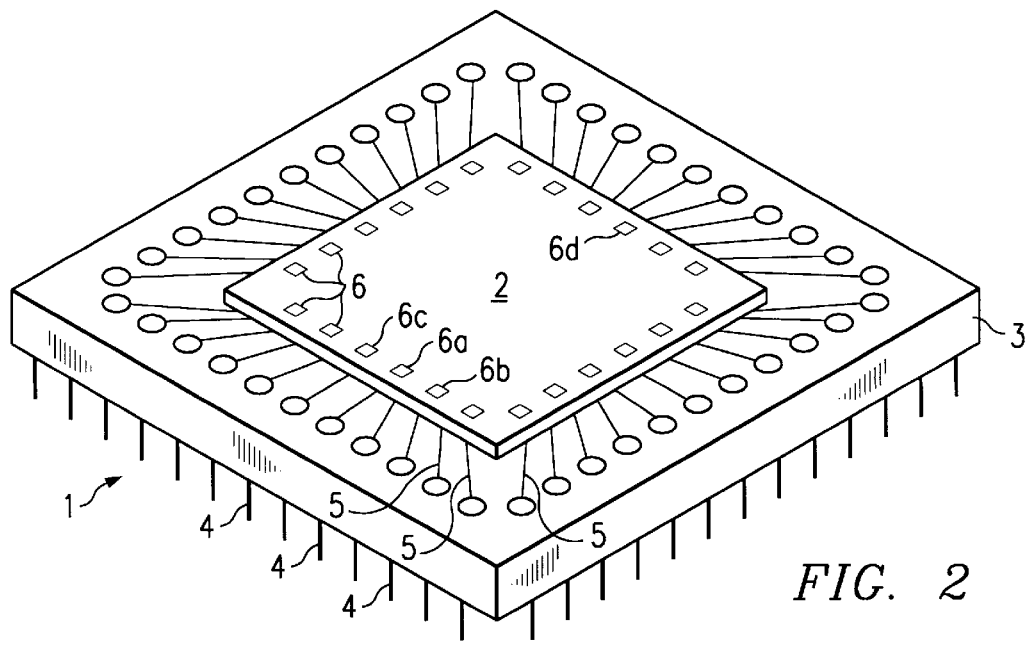
FIG. 2 is a perspective view of an example IC package with an integrated circuit MOS device thereon including protection means constructed in accordance with the present invention.

Turning now to the drawings, and specifically FIG. 2 thereof, an exemplary integrated circuit (IC) package 1 is illustrated as including an integrated circuit MOS device 2 thereon including ESD protection means constructed in accordance with the present invention. The package 1 includes an insulating platform 3 from which pins 4 depend from the lower surface thereof. The pins 4 pass through the platform and connect to leads 5, which connect in turn to input/output pads 6 on the MOS IC chip 2. While certain of the protection means may be incorporated externally of the chip 2 on the insulating platform 3, as shall be illustrated hereinafter, the ESD protection means is preferably located in the device 2 so that protection will include the handling of the device for securing it to the platform 3 of the package 1. In this connection, the present invention is not meant to exclude other ESD protection which may be imposed by the packaging of the integrated circuit 2.

Prior to discussing the elements of the ESD protection means of the present invention, some background concerning the chip or device is essential to proper understanding of the workings of the protection schemes. Turning now to FIG. 3A, a fragmentary, cross sectional view of a portion of a MOS integrated circuit chip 10 and an n-channel transistor in which salicide 11 is employed in conjunction with the chip 10, underlying the N+ contacts 12. Openings 13 are provided therein surrounding the N+ contacts of the active device so that nWELLs are unnecessary.

Salicide is a silicon compound with titanium in the compound to form into a conductive layer. The openings 13 are formed in any convenient manner, masking, etching etc and often are referred to as "salicide protected" areas. Elements that are in the salicide protected areas are referred to as SIPROT elements.

The chip substrate is composed of p-doped silicon. Intermediate the contacts 12 is the polysilicon gate 14. The N+ region is below and in electrical contact with contacts 12 through the conductive salicide layer 11. The lack of nWELLs in the N+ area enhances the turn-on of diodes and parasitic diodes.

In FIG. 3B, a fragmentary, cross sectional view of a portion of a MOS integrated circuit chip 10a. Unlike the chip 10 shown in FIG. 3A, chip 10a has no salicide layers. Without salicide, nWELLs are necessary for underlying the N+ contacts 12a to inhibit punchthrough.

In FIG. 3C, a fragmentary, cross sectional view of a p-channel or n-channel transistor 10b employing a salicide layer 11 intermediate the contacts 12b and the appropriately doped regions 16 for the contacts is shown. An LDD 18 area (lightly doped drain-source diffusion) is also shown. The polysilicon gate 14b is also shown intermediate the contacts 12b and salicide layers 11. The gate 14b, like the gate 14 shown in FIG. 3A is SIPROT (salicide protected).

FIG. 3D illustrates a fragmentary, cross sectional view of a p-channel or n-channel transistor 10c with NLDD (No Lightly Doped Drain-source Diffusion) and processed without salicide, necessitating nWELLs for the contacts 12c. The polysilicon gate 14c is illustrated intermediate the contacts 12c.

In the following discussion, the protection means discussed are all considered to be salicide protect or (SIPROT) which means that they are protected from salicide and also the protection means is not LDD (NLDD).

Figure 4:
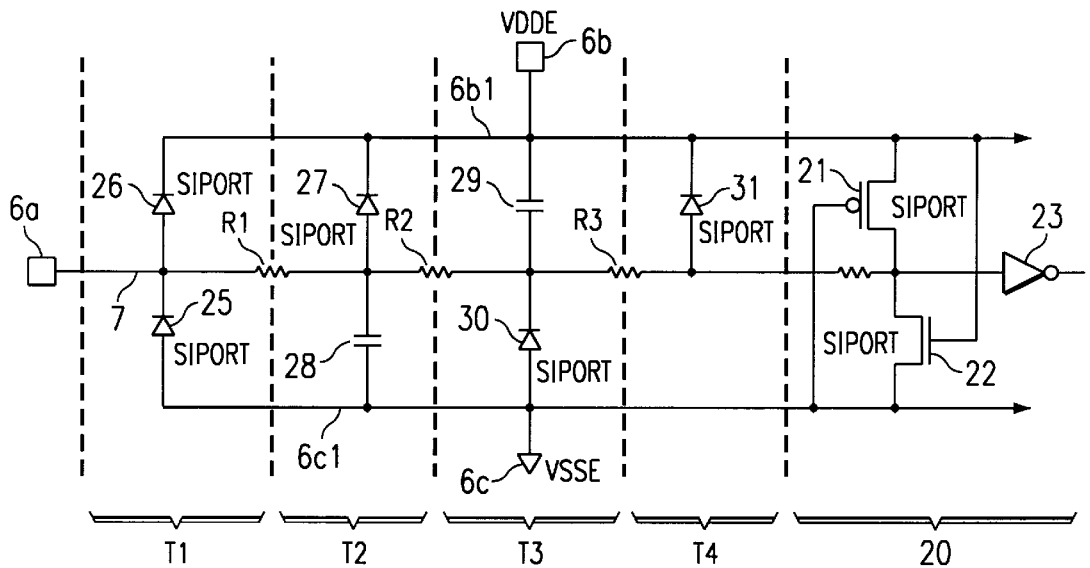
FIG. 4 is a schematic diagram illustrating a first protection scheme for input in a MOS integrated circuit device.

Turning now to FIG. 4, one of the input pads 6, designated 6a, is coupled to an input line 7 leading to a buffer 20, part of which is shown to the right in FIG. 4. A pad 6b connects the external power supply voltage VDDE to a VDDE line or rail 6b1, and a pad 6c connects the external power supply ground VSSE to a ground line or rail 6c1. The buffer 20 includes a pMOS transistor 21, the gate of which is connected to the external power supply ground VSSE through ground line 6c1, and the drain of which is connected to the power supply voltage VDDE by way of the VDDE line or rail 6b1. In a like manner, buffer 20 also includes an nMOS transistor 22, the gate of which is connected to the external power supply voltage VDDE by way of the VDDE line or rail 6b1, and the drain of which is connected to the power supply ground VSSE through ground line 6c1. (This is the proper location of pull up/pull down resistors, if any are needed or desired for the circuit). The sources of both transistors 21 and 22 are connected to the input signal line 7. The line 7 continues to an invertor-amplifier 23 and then continues to other logic and memory circuits (not shown).

In accordance with the invention, a plurality of protection diodes are arranged in tiers or stages T1-Tn on the device 2 intermediate at least the signal input line 7 and the external ground VSSE 6c via line 6c1 and an external power supply VDDE 6b via applied voltage line 6b1. At least the first of the tiers T1 comprising at least a first diode 25 between the ground gel and signal line 7, and a second diode 26 connected between the signal line 7 and supply voltage line 6b1. As shown, the diodes 26 and 25 are normally biased in the cutoff mode so that without signal on the input pad 6a, input line 7 should float at about 2 VDDE.

As shown in FIG. 4, at least a second tier T2 includes a third diode 27 connected between the ground or power supply applied voltage line 6b1, 6c1 and the signal line 7. In the illustrated instance it is connected between the voltage supply line 6b1 and input line 7. The semiconductor T2 also has at least one of a fourth diode and capacitor, in the illustrated instance a capacitor 28, connected between the other of the ground or power supply applied voltage line 6c1, 6b1 and the input signal line 7. In the present instance, capacitor 28 is connected between the ground line 6c1 and the input line 7. Intermediate the first and second tiers, T1 and T2, and in series with the signal line, is at least one low impedance resistor R1. It is preferred that this resistor be of low impedance, e.g. in the 100 ohm range, so as to offer small impedance to an input signal, but offer enough resistance to allow staging or stepping of electrostatic discharge protection between the tiers.

In the third tier T3, a Capacitor 29 is connected intermediate the external power supply VDDE 6b and the input signal line 7 and a reverse biased diode 30 is connected intermediate the signal line 7 and the external ground VSSE 6c. Connected between the second and third tiers, T2 and T3 and in series with the signal line 7, is at least another low impedance resistor R2. Like resistor R1, it is preferred that this resistor be of low impedance, e.g. in the 100 ohm range, so as to also offer small impedance to an input signal, but offer enough resistance to allow staging or stepping of electro-static discharge protection between tiers T2 and T3.

If desired, a fourth stage or tier T4 may be provided including a reverse biased diode 31 connected between the input signal line 7 and the power supply rail or line 6b1. In a like manner, tiers T3 and T4 are separated by a low impedance resistor R3.

In operation, assume that a person handling the chip 2 or integrated circuit package 1 touches the power supply pad 6b or pin associated therewith, and a charge is induced at pad 6c. The least impedance path to the pad 6b is through tier T1 and the series connected diodes 25 and 26, allowing the charge to dissipate through the human to ground. The higher impedance paths of T2 and T3 (due to the capacitors 20 and 29), while carrying some smaller portion of the electro-static discharge, will not carry the full charge. However, if the diodes 25 and 26 cannot carry all the current, the excess current will be shunted through R1 into tier T2 and diode 27 to pad 6b and the human making contact. The rationale for the low value of resistor R1 now becomes apparent. Even though a small value, the instantaneous current passing through the resistor R1 causes a voltage drop and a lowering of the impressed voltage upon diode 27.

The same analysis holds true for tier T3 and the charging capacitor 29 which acts as a voltage charge buffer and does not discharge until the voltage at VDDE (pad 6b) drops below the capacitor charge voltage. Once again, the resistor R2 serves the same purpose as resistor R1, except that the impressed voltage and the current passing along signal line 7 is once again reduced or staged. In the unlikely event that the charge is still not dissipated in the manner described above, diode 31 in tier T4 will allow any remaining charge to be dissipated through resistor R3, diode 31 and to the pad 6b.

In the event that the human is touching input pad 6a, the analysis proceeds as before from an applied charge to pad 6c (VSSE), except that the diode 25 will act as the first line of defense for shunting the charge into signal line 7 and to the input pad 6a.

Figure 5:
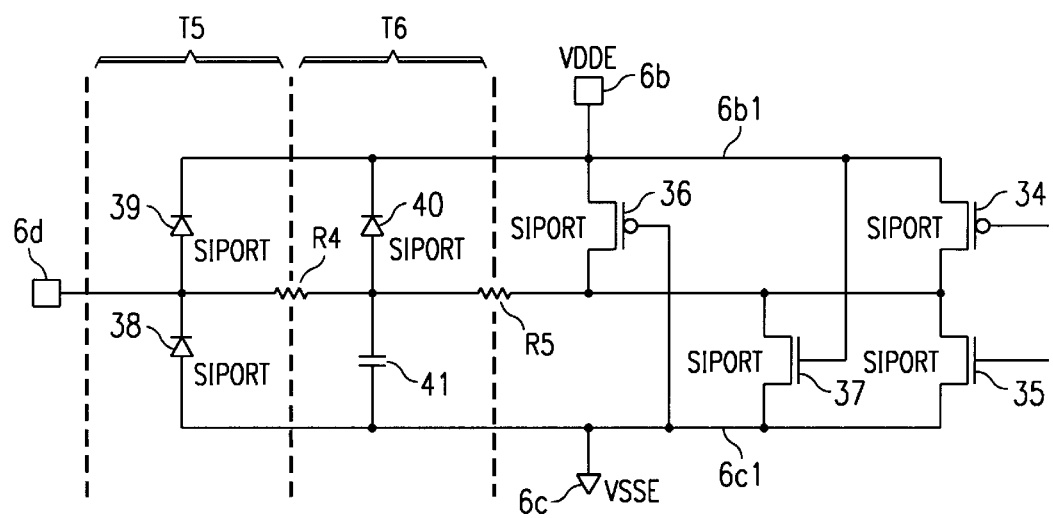
FIG. 5 is a schematic diagram illustrating a second protection scheme for outputs in a MOS integrated circuit device.

While the kind of staged protection of inputs and external to internal lines and leads described above is desirable, output lines also require a measure of protection from electro-static discharge. To this end and referring now to FIG. 5, illustrated therein is a similar form of protection to that already discussed relative to FIG. 4. Once again, a tiered protection scheme is displayed. In the right hand portion of FIG. 5 are output driver p-channel transistor 34 and n-channel transistor 35. The transistors are series connected between the power supply line 6b1 and the ground line 6c1. The output line 8 is connected to the interconnection between the two transistors. P-channel transistor 36 and n-channel transistor 37 act as part of the buffers and are also the location for pull-up and pull-down functions as necessary. As shown, the output line 8 leads to output pad 6d on the chip 2.

In accordance with a feature of the invention, the output circuitry is also protected from electro-static discharge by tiering the protection. To this end, reverse biased, series connected diodes 38 and 39 are connected between the rails 6b1 and 6c1 (VDDE and VSSE) and the output line 8 and thus the output pad 6d. As before, the first tier or stage protection T5 is separated from the second tier or stage T6 by a low impedance resistor R4. The second tier T6 is comprised of reverse biased diode 40, and capacitor 41. Diode 40 in the present instance is connected between the output line 8 and the rail 6b1 associated with the external power supply VDDE. Capacitor 41 is connected intermediate the output line 8 and the ground line 6c1.

While other tiers may be applied to the output, primarily dependent upon the ESD conditions where the package 1 is going to be used, it has been found that a two tier protection scheme plus separating the tiers from the buffers and output stages with a low impedance resistor, such as resistor R5 connected in series with R4 in the output line 8, is sufficient.

It should be recognized, that various parts of the integrated circuit MOS chip 2 have derived their power supply voltage from the external power supply voltage VDDE and ground from the external ground VSSE. Moreover, because of handling and the possibility of a charge being induced from any of the lines or leads, it is desirable to provide protection internally of the chip 2, between lines that are normally at the same potential. Just by way of example, the following table is provided and applies to all of the voltage acronyms set forth in the drawings:

| Acronym | Explanation of Acronym | Typical Voltage |
| --- | --- | --- |
| VDDE | Power supply, External | 5 volts |
| VDDI | Power supply, Internal | 5 volts |
| VPLL | Power supply, Phase locked loop | 5 volts |
| VSSE | Ground, External | 0 volts |
| VSSI | Ground, Internal | 0 volts |

It is noted that the external power supply, VDDE, is normally the power supply for the peripheral transistors, i.e. the transistors surrounding the core or central portion of the chip. The internal power supply, VDDI, normally equal to the external power supply, is the power supply for the central logic in the chip.

Turning now to FIG. 6, bi-directional diode protection is provided between the internal and external voltage lines 45 and 6b1 for shunting static charges from one to the other, depending upon source. The protection means includes a pair of MOS transistors, in the present instance n-channel, transistors, 46 and 47, one connected between a line and external ground VSSE and the other connected between another line and the external ground VSSE with their gates connected to one or the other lines dependent upon transistor type. In the present instance, inasmuch as the transistors are nMOS or n-channel types, the gates are connected to VSSE. The bi-directional diodes 48 and 49 are normally turned off inasmuch as the voltage on both lines is the same.

In operation, assume a human is holding the chip 2 and contacting pad 6b for VDDE, and charge is applied to VDDI. Under these circumstances the first diode 48 will take the current and shunt the charge to the human, protecting active circuits and the like connected to the lines 6b1 and line 45. If the opposite occurs, then the 2nd diode 49 will become the shunt path to human (assuming that it is possible for a human to touch VDDI).

Alternatively, if the person is holding ground pin VSSE, and a charge is applied through VDDI, then the first transistor 46 will shunt the current through that transistor 46 to the person. The same is true of a charge coming from VDDE, it will pass through second nMos transistor 47 to VSSE and thus to the human thereby protecting circuitry attached to one or both of lines 6b1 and 45.

The scheme shown in FIG. 7 is identical in operation to the scheme employed in FIG. 6. In FIG. 7, protection is sought between the external power supply VDDE and internal power supply line 51 for VPPL and external ground VSSE. The protection means includes a pair of MOS transistors, in the present instance n-channel, transistors, 52 and 53, one connected between the one line and external ground VSSE and the other connected between the other line and the external ground VSSE with their gates connected to one or the other lines dependent upon transistor type. In the present instance, inasmuch as the transistors are nMOS or n-channel types, the gates are connected to VSSE. The bi-directional diodes 54 and 55 are normally turned off inasmuch as the voltage on both lines is the same.

In operation, assume a human is holding the chip 2 and contacting pad 6b for VDDE, and a charge is applied to VPPL. Under these circumstances the first diode 54 will take the current and shunt the charge to the human, protecting active circuits and the like connected to the lines 6b1 and line 51. If the opposite occurs, then the 2nd diode 55 will become the shunt path to a human (assuming that it is possible for a human to touch VPLL).

Alternatively, if the person is holding ground pin for VSSE, and a charge is applied through VPPL, then the first transistor 52 will shunt the current through that transistor to the person. The same is true of a charge coming from VDDE, it will pass thru second nMOS transistor 53 to VSSE and thus to the human, protecting circuitry attached to one or both or lines 6b1 and 51.

Another protective scheme may be employed between the power line 51 for phase locked loop, VPPL, and the internal power supply line 45 (VDDI) from which it is derived. In this scheme, illustrated in FIG. 8, a pair of bidirectional diodes 56 and 57 will allow for shunting of electrostatic discharge through nMOS transistors 58 and 60 to ground VSSE to pad 6c.

In FIG. 9, additional protection for electrostatic discharge through ground, is provided. In this scheme, bidirectional diodes 61 and 62 are provided intermediate an internal ground line 65 (VSSI) and external ground power supply line 6c1 (VSSE). In the illustrated instance, nMOS transistor 66 is connected in parallel between the ground lines to facilitate quicker turn on and discharge of an ES discharge before it reaches the active circuits, and devices connected to the internal and external ground lines. Although not shown, similar protection may be applied to the ground associated with the phase locked loop circuitry.

Thus, the present invention provides means for nullifying, to the extent possible, the deleterious effects of electro-static discharge in MOS devices. Moreover, the ES protection circuits of the present invention enhances the discharge of electro-static charges on chips by providing an easier path to ground bypassing threatened active and passive elements to ground. This is accomplished in the present invention by Electro-static-discharge (ESD) protection circuits which include tiered diodes and capacitors adjacent the input and output pads of the chip. In certain specific internal areas of the chip, to protect against internal shorts to and from the power supplies, bi-directional diode protection from over-voltage caused by ESD is provided.

Although the invention has been described with a certain degree of particularity, it should be recognized that elements thereof may be altered by person(s) skilled in the art without departing from the spirit and scope of the invention as hereinafter set forth in the following claims.

What is claimed is:

1. Electrostatic protection circuitry for a MOS integrated circuit semiconductor device, said device having active and passive integrated components thereon for executing various electronic functions, and having input and output connections for inputting and outputting signals and power to and from said device, comprising:

a first tier coupled to an input pad of the MOS integrated circuit semiconductor device and comprising at least a first diode coupled to an external ground line and a second diode coupled to an external power supply voltage line and serially connected to the first diode at a first node, said first and second diodes providing a first shunt for an ESD charge on the input pad between the external ground line and the external power supply voltage line;

a first low impedance resistive element coupled to the first tier at the first node to provide a first additional ESD charge shunt in the event the first tier does not entirely shunt the ESD charge;

a second tier coupled to the first low impedance resistive element and comprising a third diode serially connected at a second node to a first bi-directional capacitive element between the external ground line and the external power supply voltage line, said third diode and said first capacitive element for providing a second shunt for the ESD charge between the external ground line and the external power supply voltage line; and an output tier coupled to the second tier between the external ground line and the external power supply voltage line and coupled to a buffer of the MOS integrated circuit semiconductor device.

2. The electrostatic protection circuitry of claim 1 wherein selected surfaces of said electrostatic protection circuitry have a salicide layer thereof.

3. The electrostatic protection circuitry of claim 2 wherein said first diode, second diode, and third diode are protected from salicide.

4. The electrostatic protection circuitry of claim 1 further comprising:

a second low impedance resistive element coupled to the second tier at the second node to provide a second additional ESD charge shunt in the event the second tier does not entirely shunt the ESD charge; and a third tier coupled between the second low impedance resistive element and the output tier and comprising a fourth diode serially connected at a third node to a second capacitive element between the external ground line and the external power supply voltage line for providing a third shunt for the ESD charge between said external ground line and said external power supply voltage line.

5. The electrostatic protection circuits of claim 4 further comprising:

a third low impedance resistive element coupled to the third tier at the third node to provide a third additional ESD charge shunt in the event the third tier does not entirely shunt the ESD charge; and a fourth tier coupled between the third low impedance resistive element and the output tier and comprising at least a fifth diode serially connected to at least one of a sixth diode and a third capacitive element between the external ground line and the external power supply voltage line, said fifth diode and said one of the sixth diode and the third capacitive element shunting an ESD charge between the external ground line and the external power supply voltage line.

6. The electrostatic protection circuitry of claim 1 further comprising:

a second low impedance resistive element coupled to the second tier at the second node to provide a second additional ESD charge shunt in the event the second tier does not entirely shunt the ESD charge; and a third tier coupled between the second low impedance resistive element and the output tier and comprising a second capacitive element coupled to either the external ground line or the external power supply voltage line, said capacitor shunting the ESD charge between said second low impedance resistive element and the corresponding external ground line or the external power supply voltage line.

7. The electrostatic protection circuitry of claim 4, wherein the series connection of the third diode and the first capacitive element with respect to the external ground line and the external power supply voltage line in the second tier is opposite in order of the series connection of the fourth diode and the second capacitive element with respect to the external ground line and the external power supply voltage line in the third tier.

8. The electrostatic protection circuitry of claim 4 further comprising:

a third low impedance resistive element coupled to the third tier at the third node to provide a third additional ESD charge shunt in the event the third tier does not entirely shunt the ESD charge; and a fourth tier coupled between the third low impedance resistive element and the output tier and comprising a fifth diode connected at a fourth node to the third low impedance resistive element and the output tier and connected to either the external ground line or the external power supply voltage line for providing a fourth shunt for the ESD charge.

* * * * *

UNITED STATES PATENT AND TRADEMARK OFFICE
CERTIFICATE OF CORRECTION

PATENT NO.     : 6,028,465
DATED          : February 22, 2000
INVENTOR(S)    : So It is certified that error appears in the above-identified patent and that said Letters Patent is hereby corrected as shown below:

Drawings,
Figures 4 and 5, occurrences of the label "SIPROT" should be -- SIPORT --.
Figure 5, the output line connected to the interconnection between transistors 34 and 35 needs to be labeled -- 8 --.
Figure 6, transistor 47 should be labeled -- NLDD --.
Figure 7, transistor 53 should be labeled -- NLDD --.
Figure 8, transistor 60 should be labeled -- NLDD --.

Column 1,
Line 10, "(SCRAM)" should be replaced with -- (SRAM) --.
Line 66, "electro-static" should be -- electrostatic --.

Column 3,
Line 34, "punchthrough." should be -- spiking through a junction. --

Column 4,
Line 2, "sources" should be -- drains --.
Line 12, "gel" should be -- 6cl --.
Line 15, "2 VDDE" should be -- (VDDE)/2 --.

Column 5,
Line 20, "electro-static" should be -- electrostatic --.

Signed and Sealed this

Third Day of December, 2002

JAMES E. ROGAN
*Director of the United States Patent and Trademark Office*